(12) United States Patent
Auman et al.

(10) Patent No.: US 8,319,299 B2
(45) Date of Patent: Nov. 27, 2012

(54) THIN FILM TRANSISTOR COMPOSITIONS, AND METHODS RELATING THERETO

(76) Inventors: Brian C. Auman, Pickerington, OH (US); Salah Boussaad, Wilmington, DE (US); Thomas Edward Carney, Orient, OH (US); Kostantinos Kourtakis, Media, PA (US)

( * ) Notice: Subject to any disclaimer, the term of this patent is extended or adjusted under 35 U.S.C. 154(b) by 233 days.

(21) Appl. No.: 12/622,789

(22) Filed: Nov. 20, 2009

(65) Prior Publication Data

US 2011/0121296 A1    May 26, 2011

(51) Int. Cl.
*H01L 27/14* (2006.01)

(52) U.S. Cl. ........ 257/431; 257/461; 257/443; 257/459; 257/55; 136/249; 136/252; 136/262

(58) Field of Classification Search .................. 136/249, 136/252, 262; 257/431, 461, 443, 459, 55
See application file for complete search history.

(56) References Cited

U.S. PATENT DOCUMENTS

| | | | |
|---|---|---|---|
| 5,837,767 A | 11/1998 | Shimokusuzuno et al. | |
| 6,372,538 B1 | 4/2002 | Wendt et al. | |
| 7,271,333 B2 | 9/2007 | Fabick et al. | |
| 7,808,593 B1* | 10/2010 | Kim et al. | 349/129 |
| 7,816,437 B2* | 10/2010 | Hwang et al. | 524/404 |
| 2005/0072461 A1 | 4/2005 | Kuchinski et al. | |
| 2005/0163968 A1 | 7/2005 | Hanket | |
| 2006/0037641 A1 | 2/2006 | Kibbel et al. | |
| 2007/0044834 A1 | 3/2007 | Berke et al. | |
| 2008/0296697 A1* | 12/2008 | Hsu et al. | 257/379 |
| 2011/0056539 A1* | 3/2011 | Auman et al. | 136/249 |

FOREIGN PATENT DOCUMENTS

| | | |
|---|---|---|
| CN | 1215741 A | 5/1999 |
| CN | 1676548 A | 10/2005 |
| DE | 102006016307 A | 10/2007 |
| JP | 63312328 A | 12/1988 |
| JP | 1998055120 A | 2/1998 |
| JP | 2003082231 A | 3/2003 |
| JP | 2004035825 A | 2/2004 |
| JP | 2004059694 A | 2/2004 |
| JP | 2006028216 A | 2/2006 |
| WO | WO 02102882 A1 | 12/2002 |

OTHER PUBLICATIONS

F. Kessler, D. Herrmann, M. Powalla, Approaches to flexible CIGS thin-film solar cells, Thin Solid Films 480-481 (2005) pp. 491-498.
A. Romeo, G. Khrypunov, F. Kurdesau, M. Arnold, D.L. Batzner, H. Zogg, A..N. Tiwari, High-efficiency flexible CdTe solar cells on polymer substrates, Solar Energy Materials & Solar Cells 90 (2006), pp. 3407-3415.
Research Disclosure 405061, Low Color Pigmented Polyimide Film, Kenneth Mason Publications Ltd., Jan. 1998.

(Continued)

*Primary Examiner* — Zandra Smith
*Assistant Examiner* — Telly Green (57) ABSTRACT

A process for forming at least one transistor on a substrate is described. The substrate comprises a polyimide and a nanoscopic filler. The polyimide is derived substantially or wholly from rigid rod monomers and the nanoscopic filler has an aspect ratio of at least 3:1. The substrates of the present disclosure are particularly well suited for thin film transistor applications, due at least in part to high resistance to hygroscopic expansion and relatively high levels of thermal and dimensional stability.

15 Claims, 1 Drawing Sheet

OTHER PUBLICATIONS

Hsu, S.C., Whang-W-T, Hung, C-H, Chiang, P-C, Hsiao, Y-N, Effect of the Polyimide Structure and ZnO Concentration on the Morphology and Characteristics of Polyimide/ZnO Nanohybrid Films. Macromol. Chem. Phys, 2005, 206, pp. 291-298.

Leu, C.M., Wu, Z-W, Wei, K-H, Synthesis and Properties of Covalently Bonded Layered Silicates/Polyimide (BTDA-ODA) Nanocomposites, Chem. Mater 2002, vol. 14, pp. 3016-3021.

Son, M., Han, S., Han, D., Kim, Y., Lim, J., Kim I, Ha, C-S, Organic/Inorganic Hybrid Composite Films from Polyimide and Organosilica: Effect of the Type of Organosilica Precursors, Polymer Bulletin 60, 2008, pp. 713-723.

Chen, Y., Iroh, J.O., Synthesis and Characterization of Polyimide/Silica Hybrid Composites, Chem. Mater, 1999, vol. 11, pp. 1218-1222.

Lin, L. Chung, D.D.L., Thermally Conducting Polymer-Matrix Composites Containing Both AlN Particles and SiC Whiskers, Journal of Electronic Materials, vol. 23, No. 6, 1994, pp. 557-564.

Zixue, Q. Feifeng, H., Polyimide composites reinforced with whiskers, Institute of Physics Publishing, High Perform. Polym. 13 (2001), pp. S343-S350.

Zhou, H.R., Liu, X.G., Zhao, D.M., Lin, F., Fan, Y., Synthesis and Characterization of nano-alumina hybrid polymide films, Pigment & Resin Technology (2008), 37(3), pp. 161-166.

Shimokusuzono, Takumi, Polyimide Compositions for copying machine paper separation apparatus, Ntn Toyo Bearing Co., Ltd., Japan, Abstract.

Khalil, M, Saeed, S., Ahmad, Z., Mechanical and Thermal Properties of Polyimide/Silica Hybrids with Imide-Modified Silica Network Structures, Journal of Applied Science, vol. 107, 2008, pp. 1257-1268.

* cited by examiner

THIN FILM TRANSISTOR COMPOSITIONS, AND METHODS RELATING THERETO

FIELD OF DISCLOSURE

The present disclosure is directed to substrates useful in the manufacture of thin film transistor ("TFT") arrays. More specifically, the films of the present disclosure comprise a rigid rod polyimide coupled with a nanoscale fiber filler.

BACKGROUND OF THE DISCLOSURE

Broadly speaking, thin film transistors (TFT's) are known. TFTs are useful in controlling various types of display, e.g., liquid crystal or electrophoretic displays and the like. Generally speaking, TFT's are commonly fabricated on rigid substrates, commonly glass. However, there is increasing interest in fabricating TFT's on flexible substrates, especially flexible polymeric films, due to lower weight and improved ruggedness (relative to glass). TFT's based upon amorphous silicon semiconductors are attractive for use on such flexible substrates since they allow fabrication with a relatively low number of process steps and with a relatively low thermal budget. However, polymeric films generally do not have sufficient thermal or dimensional stability for such TFT applications. Hence, there is an ever increasing interest in the industry to find a polymer substrate that can act as a substitute for glass in a TFT application, particularly where the polymeric substrate is able to lower overall cost, improve performance, decrease weight, increase ruggedness and simplify manufacture. U.S. Pat. No. 6,825,068 to Denis, et al. is directed to semiconductor composites where semiconductive amorphous silicon is fabricated on substrates comprising polyphenylene polyimides.

SUMMARY OF THE INVENTION

The compositions of the present disclosure comprise a filled polyimide substrate. The polyimide substrate has a thickness from about 8 to about 150 microns and contains from about 40 to about 95 weight percent of a polyimide derived from: i. at least one aromatic dianhydride, at least about 85 mole percent of such aromatic dianhydride being a rigid rod dianhydride, ii. at least one aromatic diamine, at least about 85 mole percent of such aromatic diamine being a rigid rod diamine. The polyimide substrates of the present disclosure further comprise a filler having primary particles (as a numerical average) that: i. are less than about 800 nanometers in at least one dimension; ii. have an aspect ratio greater than about 3:1; iii. are less than the thickness of the film in all dimensions; and iv. are present in an amount from about 5 to about 60 weight percent of the total weight of the substrate. The compositions of the present disclosure further comprise transistor arrays supported by such polyimide substrates.

DETAILED DESCRIPTION OF THE PREFERRED EMBODIMENT(S)

Definitions

Figure 1:
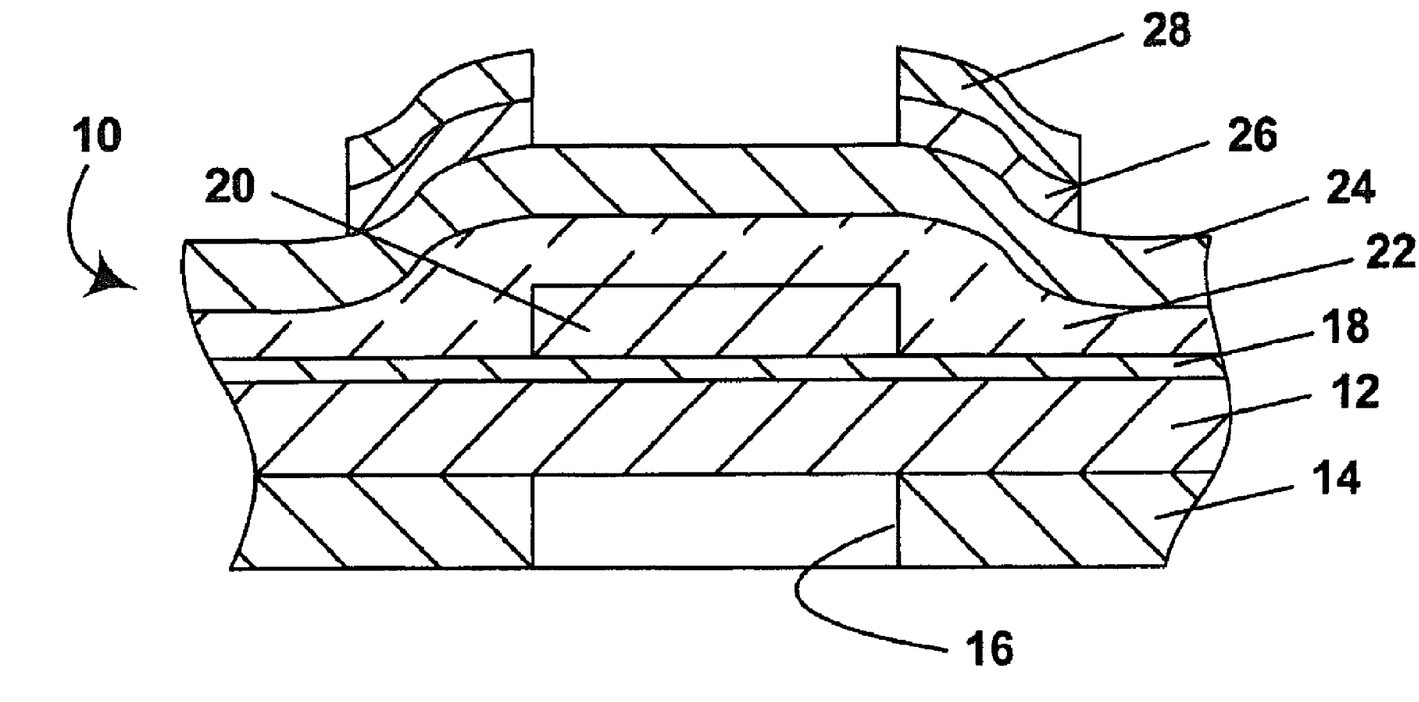
The FIGURE is a schematic cross-section through a single transistor of a thin film transistor array formed on a polyimide substrate of the present disclosure.

"Film" is intended to mean a free-standing film or a coating on a substrate. The term "film" is used interchangeably with the term "layer" and refers to covering a desired area.

"Semiconductor" is intended to mean any semiconductive material, particularly amorphous silicon, but also including any of the following:
1. Group IV semiconductors (silicon, germanium, diamond);
2. Group IV compound semiconductors (SiGe, SiC);
3. Group III-V semiconductors (AlSb, AlAs, AlN, AlP, BN, BP, BAs, GaSb, GaAs, GaN, GaP, InSb, InAs, InN, InP);
4. Group III-V semiconductor alloys (AlGaAs, InGaAs, InGaP, AlInAs, AlInAs, AlInSb, GaAsN, GaAsP, AlGaN, AlGaP, InGaN, InAsSb, InGaSb);
5. III-V quaternary semiconductor alloys (AlGaInP, AlGaAsP, InGaAsP, InGaAsP, AlInAsP, AlGaAsN, InGaAsN, InAlAsN, GaAsSbN);
6. III-V quinary semiconductor alloys (GaInNAsSb, GaInAsSbP):
7. II-VI semiconductors (CdSe, CdS, CdTe, ZnO, ZnSe, ZnS, ZnTe);
8. II-VI ternary alloy semiconductors (CdZnTe, HgCdTe, HgZnTe, HgZnSe);
9. I-VII semiconductors (CuCl);
10. IV-VI semiconductors (PbSe, PbS, PbTe, SnS, SnTe);
11. IV-VI ternary semiconductors (PbSnTe, $Tl_2SnTe_5$, $Tl_2GeTe_5$);
12. V-VI semiconductors ($Bi_2Te_3$);
13. II-V semiconductors ($Cd_3P_2$, $Cd_3As_2$, $Cd_3Sb_2$, $Zn_3P_2$, $Zn_3As_2$, $Zn_3Sb_2$);
14. layered semiconductors ($PbI_2$, $MoS_2$, GaSe, SnS, $Bi_2S_3$);
15. others (ClGS, PtSi, $BiI_3$, $HgI_2$, TlBr);
16. and the like.

"Dianhydride" as used herein is intended to also include precursors and derivatives of (or otherwise compositions related to) dianhydrides, which may not technically be dianhydrides but are nevertheless functionally equivalent due to the capability of reacting with a diamine to form a polyamic acid which in turn could be converted into a polyimide.

Similarly, "diamine" is intended to also include precursors and derivatives of (or otherwise compositions related to) diamines, which may not technically be diamines but are nevertheless functionally equivalent due to the capability of reacting with a dianhydride to form a polyamic acid which in turn could be converted into a polyimide.

As used herein, the terms "comprises," "comprising," "includes," "including," "has," "having" or any other variation thereof, are intended to cover a non-exclusive inclusion. For example, a method, process, article, or apparatus that comprises a list of elements is not necessarily limited to only those elements but may include other elements not expressly listed or inherent to such method, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, articles "a" or "an" are employed to describe elements and components of the invention. This is done merely for convenience and to give a general sense of the invention. This description should be read to include one or at least one and the singular also includes the plural unless it is obvious that it is meant otherwise.

The support films of the present disclosure resist shrinkage or creep (even under tension, such as, reel to reel processing) within a broad temperature range, such as, from about room temperature to temperatures in excess of 400° C., 425° C. or 450° C. In one embodiment, the support film of the present disclosure changes in dimension by less than 1, 0.75, 0.5, or 0.25 percent when subjected to a temperature of 450° C. for 30 minutes while under a stress in a range from 7.4-8.0 MPa (mega Pascals).

The polyimide support films of the present disclosure can be reinforced with thermally stable, inorganic: fabric, paper (e.g., mica paper), sheet, scrim or combinations thereof. The support films of the present disclosure have adequate electrical insulation or otherwise dielectric properties for TFT applications. In some embodiments, the support films of the present disclosure provide:

i. low surface roughness, i.e., an average surface roughness (Ra) of less than 1000, 750, 500, 400, 350, 300 or 275 nanometers;
ii. low levels of surface defects; and/or
iii. other useful surface morphology, to diminish or inhibit unwanted defects, such as, electrical shorts.

In one embodiment, the films of the present disclosure have an in-plane CTE in a range between (and optionally including) any two of the following: 1, 5, 10, 15, 20, and 25 ppm/° C., where the in-plane coefficient of thermal expansion (CTE) is measured between 50° C. and 350° C. In some embodiments, the CTE within this range is further optimized to further diminish or eliminate unwanted cracking due to thermal expansion mismatch of any particular supported semiconductor material selected in accordance with the present disclosure. Generally, when forming the polyimide, a chemical conversion process (as opposed to a thermal conversion process) will provide a lower CTE polyimide film. This is particularly useful in some embodiments, as very low CTE (<10 ppm/° C.) values can be obtained, closely matching those of the delicate conductor and semiconductor layer deposited thereon. Chemical conversion processes for converting polyamic acid into polyimide are well known and need not be further described here. The thickness of a polyimide support film can also impact CTE, where thinner films tend to give a lower CTE (and thicker films, a higher CTE), and therefore, film thickness can be used to fine tune film CTE, depending upon any particular application selected.

The films of the present disclosure have a thickness in a range between (and optionally including) any of the following thicknesses (in microns): 4, 6, 8, 10, 12, 15, 20, 25, 50, 75, 100, 125 and 150 microns. Monomers and fillers within the scope of the present disclosure can also be selected or optimized to fine tune CTE within the above range. Ordinary skill and experimentation may be necessary in fine tuning any particular CTE of the polyimide films of the present disclosure, depending upon the particular application selected. The in-plane CTE of the polyimide film of the present disclosure can be obtained by thermomechanical analysis utilizing a TA Instruments TMA-2940 run at 10° C./min, up to 380° C., then cooled and reheated to 380° C., with the CTE in ppm/° C. obtained during the reheat scan between 50° C. and 350° C.

The polyimide support films of the present disclosure should have high thermal stability so the films do not substantially degrade, lose weight, have diminished mechanical properties, or give off significant volatiles, e.g., during the semiconductor deposition process. The polyimide support films of the present disclosure should be thin enough to not add excessive weight or cost, but thick enough to provide high electrical insulation at operating voltages, which in some cases may reach 400, 500, 750 or 1000 volts or more.

In accordance with the present disclosure, a filler is added to the polyimide film to increase the polyimide storage modulus. In some embodiments, the filler of the present disclosure will maintain or lower the coefficient of thermal expansion (CTE) of the polyimide layer while still increasing the modulus. In some embodiments, the filler increases the storage modulus above the glass transition temperature (Tg) of the polyimide film. The addition of filler typically allows for the retention of mechanical properties at high temperatures and can improve handling characteristics. The fillers of the present disclosure:

1. have a dimension of less than 800 nanometers (and in some embodiments, less than 750, 650, 600, 550, 500, 475, 450, 425, 400, 375, 350, 325, 300, 275, 250, 225, or 200 nanometers) in at least one dimension (since fillers can have a variety of shapes in any dimension and since filler shape can vary along any dimension, the "at least one dimension" is intended to be a numerical average along that dimension);
2. have an aspect ratio greater than 3, 4, 5, 6, 7, 8, 9, 10, 11, 12, 13, 14, or 15 to 1;
3. is less than 100, 95, 90, 85, 80, 75, 70, 65, 60, 55, 50, 45, 40, 35, 30, 25, 20, 15 or 10 percent of the thickness of the film in all dimensions; and
4. is present in an amount between and optionally including any two of the following percentages: 5, 10, 15, 20, 25, 30, 35, 40, 45, 50, 55, and 60 weight percent, based upon the total weight of the film.

Suitable fillers are generally stable at temperatures above 450° C., and in some embodiments do not significantly decrease the electrical insulation properties of the film. In some embodiments, the filler is selected from a group consisting of needle-like fillers, fibrous fillers, platelet fillers and mixtures thereof. In one embodiment, the fillers of the present disclosure exhibit an aspect ratio of at least 3, 4, 5, 6, 7, 8, 9, 10, 11, 12, 13, 14, or 15 to 1. In one embodiment, the filler aspect ratio is 6:1 or greater. In another embodiment, the filler aspect ratio is 10:1 or greater, and in another embodiment, the aspect ratio is 12:1 or greater. In some embodiments, the filler is selected from a group consisting of oxides (e.g., oxides comprising silicon, titanium, magnesium and/or aluminum), nitrides (e.g., nitrides comprising boron and/or silicon) or carbides (e.g., carbides comprising tungsten and/or silicon). In some embodiments, the filler comprises oxygen and at least one member of the group consisting of aluminum, silicon, titanium, magnesium and combinations thereof. In some embodiments, the filler comprises platelet talc, acicular titanium dioxide, and/or acicular titanium dioxide, whereby at least a portion of the filler is coated with an aluminum oxide. In some embodiments, the filler is less than 50, 25, 20, 15, 12, 10, 8, 6, 5, 4, or 2 microns in all dimensions.

In yet another embodiment, carbon fiber and graphite can be used in combination with other fillers to increase mechanical properties. However, oftentimes care must be taken to keep the loading of graphite and/or carbon fiber below 10%, since graphite and carbon fiber fillers can diminish insulation properties and in many embodiments, diminished electrical insulation properties is not desirable. In some embodiments, the filler is coated with a coupling agent. In some embodiments, the filler is coated with an aminosilane coupling agent. In some embodiments, the filler is coated with a dispersant. In some embodiments, the filler is coated with a combination of a coupling agent and a dispersant. Alternatively, the coupling agent and/or dispersant can be incorporated directly into the film and not necessarily coated onto the filler.

In some embodiments, a filtering system is used to ensure that the final film will not contain discontinuous domains greater than the desired maximum filler size. In some embodiments, the filler is subjected to intense dispersion energy, such as agitation and/or high shear mixing or media milling or other dispersion techniques, including the use of dispersing agents, when incorporated into the film (or incorporated into a film precursor) to inhibit unwanted agglomeration above the desired maximum filler size. As the aspect ratio of the filler increases, so too does the tendency of the filler to align or otherwise position itself between the outer surfaces of the film, thereby resulting in a increasingly smooth film, particularly as the filler size decreases.

Generally speaking, film smoothness is desirable in the TFT applications of the present disclosure, since surface roughness can interfere with the functionality of the layer or layers deposited thereon, can increase the probability of electrical or mechanical defects and can diminish property uniformity along the film. In one embodiment, the filler (and any other discontinuous domains) are sufficiently dispersed during film formation, such that the filler (and any other discontinuous domains) are sufficiently between the surfaces of the film upon film formation to provide a final film having an average surface roughness (Ra) of less than 1000, 750, 500 or 400 nanometers. Surface roughness as provided herein can be determined by optical surface profilometry to provide Ra values, such as, by measuring on a Veeco Wyco NT 1000 Series instrument in VSI mode at 25.4× or 51.2× utilizing Wyco Vision 32 software.

In some embodiments, the filler is chosen so that it does not itself degrade or produce off-gasses at the desired processing temperatures. Likewise in some embodiments, the filler is chosen so that it does not contribute to degradation of the polymer.

Useful polyimides of the present disclosure are derived from: i. at least one aromatic diamine, at least 85, 90, 95, 96, 97, 98, 99, 99.5 or 100 mole percent being a rigid rod type monomer; and ii. at least one aromatic dianhydride, at least 85, 90, 95, 96, 97, 98, 99, 99.5 or 100 mole percent being a rigid rod type monomer. Suitable rigid rod type, aromatic diamine monomers include: 1,4-diaminobenzene (PPD), 4,4'-diaminobiphenyl, 2,2'-bis(trifluoromethyl) benzidene (TFMB), 1,4-naphthalenediamine, and/or 1,5-naphthalenediamine. Suitable rigid rod type, aromatic dianhydride monomers include pyromellitic dianhydride (PMDA), and/or 3,3', 4,4'-biphenyl tetracarboxylic dianhydride (BPDA).

In some embodiments, other monomers may also be considered for up to 15 mole percent of the aromatic dianhydride and/or up to 15 mole percent of the aromatic diamine, depending upon desired properties for any particular application of the present invention, for example: 3,4'-diaminodiphenyl ether (3,4'-ODA), 4,4'-diaminodiphenyl ether (4,4'-ODA), 1,3-diaminobenzene (MPD), 4,4'-diaminodiphenyl sulfide, 9,9'-bis(4-aminophenyl)fluorene, 3,3',4,4'-benzophenone tetracarboxylic dianhydride (BTDA), 4,4'-oxydiphthalic anhydride (ODPA), 3,3',4,4'-diphenyl sulfone tetracarboxylic dianhydride (DSDA), 2,2-bis(3,4-dicarboxyphenyl) hexafluoropropane dianhydride (6FDA), and mixtures thereof. Polyimides of the present disclosure can be made by methods well known in the art and their preparation need not be discussed in detail here.

In some embodiments, the film is manufactured by incorporating the filler into a film precursor material, such as, a solvent, monomer, prepolymer and/or polyamic acid composition. Ultimately, a filled polyamic acid composition is generally cast into a film, which is subjected to drying and curing (chemical and/or thermal curing) to form a filled polyimide free-standing or non free-standing film. Any conventional or non-conventional method of manufacturing filled polyimide films can be used in accordance with the present disclosure. The manufacture of filled polyimide films is well known and need not be further described here. In one embodiment, the polyimide of the present disclosure has a high glass transition temperature (Tg) of greater than 300, 310, 320, 330, 340, 350, 360, 370 380, 390 or 400° C. A high Tg generally helps maintain mechanical properties, such as storage modulus, at high temperatures.

In some embodiments, the crystallinity and amount of crosslinking of the polyimide support film can aid in storage modulus retention. In one embodiment, the polyimide support film storage modulus (as measured by dynamic mechanical analysis, DMA) at 480° C. is at least: 400, 450, 500, 550, 600, 650, 700, 750, 800, 850, 900, 950, 1000, 1100, 1200, 1300, 1400, 1500, 1600, 1800, 2000, 2200, 2400, 2600, 2800, 3000, 3500, 4000, 4500, or 5000 MPa.

In some embodiments, the polyimide support film of the present disclosure has an isothermal weight loss of less than 1, 0.75, 0.5 or 0.3 percent at 500° C. over about 30 minutes under inert atmosphere. Polyimides of the present disclosure have high dielectric strength, generally higher than common inorganic insulators. In some embodiments, polyimides of the present disclosure have a breakdown voltage equal to or greater than 10 V/micrometer. In some embodiments the filler is selected from a group consisting of oxides, nitrides, carbides and mixtures thereof, and the film has at least 1, 2, 3, 4, 5, or all 6 of the following properties: i. a Tg greater than 300° C., ii. a dielectric strength greater 500 volts per 25.4 microns, iii. an isothermal weight loss of less than 1% at 500° C. over 30 minutes in an inert atmosphere, iv. an in-plane CTE of less than 25 ppm/° C., v. an absolute value stress free slope of less than 10 times $(10)^{-6}$ per minute, and vi. an $e_{max}$ of less than 1% at 7.4-8MPa. In some embodiments, the film of the present disclosure is reinforced with a thermally stable, inorganic: fabric, paper, sheet, scrim or a combination thereof.

In some embodiments, electrically insulating fillers may be added to modify the electrical properties of the film. In some embodiments, it is important that the polyimide support film be free of pinholes or other defects (foreign particles, gels, filler agglomerates or other contaminates) that could adversely impact the electrical integrity and dielectric strength of the polyimide support film, and this can generally be addressed by filtering. Such filtering can be done at any stage of the film manufacture, such as, filtering solvated filler before or after it is added to one or more monomers and/or filtering the polyamic acid, particularly when the polyamic acid is at low viscosity, or otherwise, filtering at any step in the manufacturing process that allows for filtering. In one embodiment, such filtering is conducted at the minimum suitable filter pore size or at a level just above the largest dimension of the selected filler material.

A single layer film can be made thicker in an attempt to decrease the effect of defects caused by unwanted (or undesirably large) discontinuous phase material within the film. Alternatively, multiple layers of polyimide may be used to diminish the harm of any particular defect (unwanted discontinuous phase material of a size capable of harming desired properties) in any particular layer, and generally speaking, such multilayers will have fewer defects in performance compared to a single polyimide layer of the same thickness. Using multiple layers of polyimide films can diminish or eliminate the occurrence of defects that may span the total thickness of the film, because the likelihood of having defects that overlap in each of the individual layers tends to be extremely small. Therefore, a defect in any one of the layers is much less likely to cause an electrical or other type failure through the entire thickness of the film. In some embodiments, the polyimide support film comprises two or more polyimide layers. In some embodiments, the polyimide layers are the same. In some embodiments, the polyimide layers are different. In some embodiments, the polyimide layers independently may comprise a thermally stable filler, reinforcing fabric, inorganic paper, sheet, scrim or combinations thereof. Optionally, 0-60 weight percent of the film also includes other ingredients (in addition to polyimide polymer) to modify properties as desired or required for any particular application.

The aforementioned properties of the polyimide substrates of the present disclosure are well adapted for use in a roll-to-roll process, in which deposition of additional layers in the manufacture of TFTs can be effected on a continuous web of the polyimide substrate.

The polyimide substrate has sufficient thermal and dimensional stability that a metal (or other reinforcement) backing layer is generally not necessary. However such reinforcement can optionally be placed on the film surface opposite to that on which the transistor layer is to be deposited. In TFT applications, such a metal (or other reinforcement) backing layer is generally unnecessary or can be applied at a much smaller thickness, e.g. only about 10, 20, 30, 50, or 75 nanometers, relative to the use of a conventional such metal layer. The metal layer can be useful in enhancing the mechanical integrity of the film during the transistor fabrication process, thus further ensuring against any tendency for the polyimide film to stretch or otherwise distort during handling, and thus reducing the possibility of distortion of the substrate during formation of the transistors thereon. In addition, a metal (or other reinforcement) backing layer can act as a light barrier to decrease any unwanted photo-effects in the semiconductor material (for example, photogenerated current in an amorphous silicon film) caused by light incident on the rear surface of the polyimide film. The metal (or other reinforcement) backing layer, if used, need not be continuous; this layer may have apertures extending through it to reduce its stiffness and thus give the metal-backed substrate more flexibility. If such apertures are to be provided, it is generally desirable that they be formed in a regular pattern, and accordingly some or all of the apertures may be used for mechanical registration of the substrate with apparatus used in the fabrication process. Indeed, in some cases, a patterned metal backing layer might be used as a shadow mask for exposure of photoresist in a patterning step during formation of the transistors on the substrate. Alternatively or in addition, it may be advantageous to incorporate a dye into the polyimide itself to refuse or eliminate such undesirable photo-effects.

In one embodiment, a passivating layer of silica, aluminum nitride, silicon nitride or other material is deposited on the substrate prior to the deposition of the transistors. Such a passivating layer is optional however, since the polyimide substrates of the present disclosure have: i. relatively high thermal and dimensional stability; ii. relatively low hygroscopic expansion; and/or iii. relatively high surface electrical resistivity (typically >$10^{16}$ Ohms). Such a passivating layer can optionally be used, and if used, the passivation layer can generally be of a thickness that is less than conventional due to the excellent performance of the polyimide substrate, e.g., in a range between and optionally including any two of the following thicknesses: 4, 5, 8, 10, 12, 15, 20, 25 and 50 nm. Passivation can be useful not only for increasing the surface resistance of the polyimide surface, and thus for increasing electrical insulation between adjacent conductors, but also for increasing the dimensional stability of the substrate by preventing the substrate from absorbing water during processing, and for the latter purpose it is desirable to place the passivating layer on both surfaces of the substrate. The performance of the substrates of the present invention is such that a conventional post-bake of the passivated substrate may be unnecessary. If such post-baking of the passivated substrate is desired, it can be carried out at a temperature that is less than conventional, e.g., at a temperature optionally less than about 300, 275 or 250° C. for a period of time optionally less than conventional, e.g., less than about 1,2, 3, 4, 5 or 6 hours. Such post baking of the substrate with the transistor layer thereon can drive off water and any other volatile materials absorbed on the polyimide, thus reducing swelling of the polyimide due to water absorption and increasing the dimensional stability of the polyimide during the formation of transistors thereon.

In one embodiment, an inverted transistor design is conducted, in which the gate electrodes lie adjacent the substrate. To form such inverted transistors, the first step (after any optional passivation and/or optional pre-baking of the substrate in the ways already described) is the deposition of a metal layer, e.g., chromium, on the substrate. The metal can be deposited as a continuous film, typically having a thickness in the range of about 50 to about 200 nm, and thereafter the metal can be patterned, typically by conventional photolithographic techniques, prior to the deposition of the semiconductor material, to form the gate electrodes and the select lines of the transistor array to be formed. In such an embodiment, the next step in the process is the deposition of a layer of dielectric material, for example silicon nitride; this deposition can be conveniently effected by plasma enhanced chemical vapor deposition. The semiconductor material, such as amorphous silicon, is then deposited, such as by plasma enhanced chemical vapor deposition. The amorphous silicon layer (and the associated dielectric layer) can be left unpatterned so that the amorphous silicon layer extends continuously between pairs of adjacent transistors. Next, a layer of n-type silicon can be deposited over the amorphous silicon by plasma enhanced chemical vapor deposition. Finally (after a cleaning step to remove residues from the chemical vapor deposition processes) a metal layer, for example an aluminum layer, can be deposited over the n-type silicon layer by thermal evaporation. The metal layer can then be patterned to form source and drain electrodes by conventional photolithographic techniques, and the patterned metal layer can be used as an etch mask for a reactive ion etch of the n-type silicon layer, e.g., etching with a carbon tetrafluoride/oxygen mixture.

One embodiment of the present disclosure will now be described in more detail, though by way of illustration only, with reference to the accompanying drawing, which shows a schematic cross-section through a single transistor formed on a polyimide substrate of the present disclosure. The accompanying drawing shows a single transistor of a transistor array (generally designated 10) formed on a polyimide substrate 12. This substrate 12 is shown in the drawing provided with an optional stainless steel metal backing layer 14 through which extend regularly-spaced apertures 16, only one of which is visible in the drawing. On the upper surface of the substrate 12 (as shown in the drawing), there is deposited an optional passivating layer 18 formed of silica or silicon nitride. to cause delamination of various layers from this substrate.

On the upper surface of passivating layer 18, there are deposited an array of spaced metal gate electrodes 20 (only one of which is seen in the drawing), and above the electrodes 20 are deposited successively a dielectric layer 22, formed of silicon nitride, and a layer 24 of amorphous silicon. The dielectric layer 22 and the amorphous silicon layer 24 can be left unpatterned. Finally, the transistor array comprises a layer 26 of n-type silicon and a metal electrode layer 28; both of these layers are patterned using any conventional process to provide the source and drain electrodes of the transistors.

In another embodiment of the TFT is generally similar to that described above, but has a polyimide substrate without a metal backing or passivating layer. In such an embodiment, the polyimide substrate may optionally be pre-baked, and a layer of chromium at 100 nm thickness can be deposited upon the substrate by thermal evaporation and photolithographically patterned to form the gate electrodes and select lines of the final transistor array. Next, a 320 nm layer of silicon nitride dielectric can be deposited on the substrate by plasma enhanced chemical vapor deposition (PECVD) using a silane/ammonia mixture; during this deposition, the substrate is subject to a processing temperature of 300, 325, 350, 375, 400, 425 or 450° C. A 160 nm layer of amorphous silicon semiconductor material can then be deposited by PECVD from pure silane, followed by deposition of a 40 nm layer of n-type amorphous silicon by PECVD from a silane/phosphine mixture.

Following these PECVD steps, a layer of aluminum can be deposited on the substrate and patterned photolithographically to form the source and drain electrodes of the transistor array. The substrate can be then subjected to a reactive ion etch using a carbon tetrafluoride/oxygen mixture to pattern the n-type silicon layer using the patterned aluminum layer as an etch mask; the amorphous silicon and silicon nitride layers need not be patterned during this step. Finally, a low resolution patterning step can be used to pattern the amorphous silicon and silicon nitride layers to enable electrical contact to be made with the select bond line sites.

The thin film transistor array thus fabricated can be used directly in the manufacturer of an electrophoretic display, or other types of display, without further processing. In some cases, it is desirable to provide a barrier layer covering the thin film transistors to protect the transistors against the effects of solvents or other materials which may tend to diffuse out of the electrophoretic display.

Thin film transistor arrays produced by the processes of the present disclosure can be used in encapsulated electrophoretic displays such as those described in U.S. Pat. Nos. 5,930,026; 5,961,804; 6,017,584; 6,067,185; 6,118,426; 6,120,588; 6,120,839; 6,124,851; 6,130,773; 6,130,774; and 6,172,798.

From the foregoing, it will be seen that the process of the present invention provides a process for forming transistors on a flexible substrate which permits the use of higher processing temperatures than prior art processes, and which can thus produce semiconductor layers of higher quality than prior art processes. The substrate used in the present process has a coefficient of thermal expansion which closely matches that of most semiconductor layers, so reducing the risk of cracking and/or delamination of the semiconductor layer due to differences in thermal expansion between this layer and the substrate. The present invention provides a process which is well-adapted to roll-to-roll operation, and thus the present process is very suitable for the fabrication of large area transistor arrays on flexible substrates.

EXAMPLES

The invention will be further described in the following examples, which are not intended to limit the scope of the invention described in the claims. In these examples, "prepolymer" refers to a lower molecular weight polymer made with a slight stoichiometric excess of diamine monomer (ca. 2%) to yield a Brookfield solution viscosity in the range of about 50-100 poise at 25° C. Increasing the molecular weight (and solution viscosity) was accomplished by adding small incremental amounts of additional dianhydride in order to approach stoichiometric equivalent of dianhydride to diamine.

In the following examples, the following abbreviations are used:
BPDA=3,3',4,4'-biphenyl tetracarboxylic dianhydride
PPD=1,4-diaminobenzene Example 1

BPDA/PPD prepolymer (69.3 g of a 17.5 wt % solution in anhydrous DMAC) was combined with 5.62 g of acicular $TiO_2$ (FTL-110, Ishihara Corporation, USA) and the resulting slurry was stirred for 24 hours. In a separate container, a 6 wt % solution of pyromellitic anhydride (PMDA) was prepared by combining 0.9 g of PMDA (Aldrich 412287, Allentown, Pa.) and 15 ml of DMAC.

The PMDA solution was slowly added to the prepolymer slurry to achieve a final viscosity of 653 poise. The formulation was stored overnight at 0° C. to allow it to degas.

The formulation was cast using a 25 mil doctor blade onto a surface of a glass plate to form a 3"×4" film. The glass was pretreated with a release agent to facilitate removal of the film from the glass surface. The film was allowed to dry on a hot plate at 80° C. for 20 minutes. The film was subsequently lifted off the surface, and mounted on a 3"×4" pin frame.

After further drying at room temperature under vacuum for 12 hours, the mounted film was placed in a furnace (Thermolyne, F6000 box furnace). The furnace was purged with nitrogen and heated according to the following temperature protocol:
125° C. (30 min)
125° C. to 350° C. (ramp at 4° C./min)
350° C. (30 min)
350° C. to 450° C. (ramp at 5° C./min)
450° C. (20 min)
450° C. to 40° C. (cooling at 8° C./min)

Comparative Example A

An identical procedure as described in Example 1 was used, except that no $TiO_2$ filler was added to the prepolymer solution. The final viscosity, before casting, was 993 poise.

Example 2

The same procedure as described in Example 1 was used, except that 69.4 g of BPDA/PPD prepolymer (17.5 wt % in DMAC) was combined with 5.85 g of $TiO_2$ (FTL-200, Ishihara USA). The final viscosity of the formulation prior to casting was 524 poise.

Example 3

The same procedure as described in Example 1 was used, except that 69.4 g of BPDA/PPD prepolymer was combined with 5.85 g of acicular $TiO_2$ (FTL-300, Ishihara USA). The final viscosity prior to casting was 394 poise.

Example 4A

The same procedure as described in Example 1 was used, except that 69.3 g of BPDA/PPD prepolymer (17.5 wt % in DMAC) was combined with 5.62 g of acicular $TiO_2$ (FTL-100, Ishihara USA).

The material was filtered through 80 micron filter media (Millipore, polypropylene screen, 80 micron, PP 8004700) before the addition of the PMDA solution in DMAC.

The final viscosity before casting was 599 poise.

Example 4

The same procedure as described in Example 1 was followed, except that 139 g of BPDA/PPD prepolymer (17.5 wt % in DMAC) was combined with 11.3 g of acicular $TiO_2$ (FTL-100). The mixture of BPDA/PPD prepolymer with acicular $TiO_2$ (FTL-110) was placed in a small container. A Silverson Model L4RT high-shear mixer (Silverson Machines, LTD, Chesham Baucks, England) equipped with a square-hole, high-shear screen was used to mix the formulation (with a blade speed of approximately 4000 rpm) for 20 minutes. An ice bath was used to keep the formulation cool during the mixing operation.

The final viscosity of the material before casting was 310 poise.

Example 5

The same procedure as described in Example 4 was used, except that 133.03 g of BPDA/PPD prepolymer (17.5 wt % in DMAC) was combined with 6.96 g of acicular $TiO_2$ (FTL-110).

The material was placed a small container and mixed with a high-shear mixer (with a blade speed of approximately 4000 rpm) for approximately 10 min. The material was then filtered through 45 micron filter media (Millipore, 45 micron polypropylene screen, PP4504700).

The final viscosity was approximately 1000 poise, prior to casting.

Example 6

The same procedure as described in Example 5 was used, except that 159.28 g of BPDA/PPD prepolymer was combined with 10.72 g of acicular $TiO_2$ (FTL-110). The material was mixed with a high-shear mixer for 5-10 minutes.

The final formulation viscosity prior to casting was approximately 1000 poise.

Example 7

The same procedure as described in Example 5 was used, except that 157.3 g of BPDA/PPD prepolymer was combined with 12.72 grams of acicular $TiO_2$ (FTL-110). The material was blended with the high shear mixer for approximately 10 min.

The final viscosity prior to casting was approximately 1000 poise.

Example 8

A procedure similar to that described in Example 5 was used, except that 140.5 g of DMAC was combined with 24.92 g of $TiO_2$ (FTL-110). This slurry was blended using a high-shear mixer for approximately 10 minutes.

This slurry (57.8 g) was combined with 107.8 g of BPDA/PPD prepolymer (17.5 wt % in DMAC) in a 250 ml, 3-neck, round-bottom flask. The mixture was slowly agitated with a paddle stirrer overnight under a slow nitrogen purge. The material was blended with the high-shear mixer a second time (approximately 10 min, 4000 rpm) and then filtered through 45 micron filter media (Millipore, 45 micron polypropylene, PP4504700).

The final viscosity was 400 poise.

Example 9

The same procedure as described in Example 8 was used, except that 140.49 g of DMAC was combined with 24.89 g of talc (Flex Talc 610, Kish Company, Mentor, Ohio). The material was blended using the high-shear mixing procedure described in Example 8.

This slurry (69.34 g) was combined with 129.25 g of BPDA/PPD prepolymer (17.5 wt % in DMAC), mixed using a high-shear mixer a second time, and then filtered through 25 micron filter media (Millipore, polypropylene, PP2504700) and cast at 1600 poise.

Example 10

This formulation was prepared at a similar volume % (with $TiO_2$, FTL-110) to compare with Example 9. The same procedure as described in Example 1 was used. 67.01 g of BPDA/PPD prepolymer (17.5 wt %) was combined with 79.05 grams of acicular $TiO_2$ (FTL-110) powder. The formulation was finished to a viscosity of 255 poise before casting.

A Dynamic Mechanical Analysis (DMA) instrument was used to characterize the mechanical behavior of Comparative Example A and Example 10. DMA operation was based on the viscoelastic response of polymers subjected to a small oscillatory strain (e.g., 10 μm) as a function of temperature and time (TA Instruments, New Castle, Del., USA, DMA 2980). The films were operated in tension and multifrequency-strain mode, where a finite size of rectangular specimen was clamped between stationary jaws and movable jaws. Samples of 6-6.4 mm width, 0.03-0.05 mm thickness and 10 mm length in the MD direction were fastened with 3 in-lb torque force. The static force in the length direction was 0.05 N with autotension of 125%. The film was heated at frequency of 1 Hz from 0° C. to 500° C. at 3° C./min rate. The storage modulii at room temperature, 500 and 480° C. are recorded on Table 1.

The coefficient of thermal expansion of Comparative Example A and Example 10 were measured by thermomechanical analysis (TMA). A TA Instrument model 2940 was set up in tension mode and furnished with an $N_2$ purge of 30-50 ml/min rate and a mechanical cooler. The film was cut to a 2.0 mm width in the MD (casting) direction and clamped lengthwise between the film clamps allowing a 7.5-9.0 mm length. The preload tension was set for 5 grams force. The film was then subjected to heating from 0° C. to 400° C. at 10° C./min rate with 3 minutes hold, cooling back down to 0° C. and reheating to 400° C. at the same speed. The calculations of thermal expansion coefficient in units of μm/m-C (or ppm/° C.) from 60° C. to 400° C. were reported for the casting direction (MD) for the second heating cycle over 60° C. to 400° C., and also over 60° C. to 350° C.

A thermogravimetric analysis instrument (TA, Q5000) was used for sample measurements of weight loss. Measurements were performed in flowing nitrogen. The temperature program involved heating at a rate of 20° C./min to 500° C. The weight loss after holding for 30 minutes at 500° C. is calculated by normalizing to the weight at 200° C., where any adsorbed water was removed, to determine the decomposition of polymer at temperatures above 200° C.

TABLE 1

| Example # | Storage Modulus (DMA) at 500° C. (480° C.), MPa | CTE, ppm/° C. 400 C., (350° C.) | TGA, % wt loss at 500° C., 30 min, normalized to weight at 200° C. |
|---|---|---|---|
| 10 | 4000 (4162) | 17.9, (17.6) | 0.20 |
| Comparative A | Less than 200 (less than 200) | 11.8, (10.8) | 0.16 |

Comparative Example B

The same procedure as described in Example 8 was used, with the following differences. 145.06 g of BPDA/PPD prepolymer was used (17.5 wt % in DMAC).

127.45 grams of Wallastonite powder (Vansil HR325, R. T. Vanderbilt Company, Norwalk Conn.) having a smallest dimension greater than 800 nanometers (as calculated using an equivalent cylindrical width defined by a 12:1 aspect ratio and an average equivalent spherical size distribution of 2.3 microns) was combined with 127.45 grams of DMAC and high shear mixed according to the procedure of Example 8.

145.06 g of BPDA/PPD prepolymer (17.5 wt % in DMAC) was combined with 38.9 grams of the high shear mixed slurry of wollastonite in DMAC. The formulation was high shear mixed a second time, according to the procedure of Example 8.

The formulation was finished to a viscosity of 3100 poise and then diluted with DMAC to a viscosity of 600 poise before casting.

Measurement of High Temperature Creep

A DMA (TA Instruments Q800 model) was used for a creep/recovery study of film specimens in tension and customized controlled force mode. A pressed film of 6-6.4 mm width, 0.03-0.05 mm thickness and 10 mm length was clamped between stationary jaws and movable jaws in 3 in-lb torque force. The static force in the length direction was 0.005N. The film was heated to 460° C. at 20° C./min rate and held at 460° C. for 150 min. The creep program was set at 2 MPa for 20 min, followed by recovery for 30 min with no additional force other than the initial static force of (0.005N). The creep/recovery program was repeated for 4 MPa and 8 MPa and the same time intervals as that for 2 MPa.

In Table 2 below are tabulated the strain and the recovery following the cycle at 8 MPa (more precisely, the maximum stress being from about 7.4 to 8.0 MPa). The elongation is converted to a unitless equivalent strain by dividing the elongation by the starting film length. The strain at 8 MPa (more precisely, the maximum stress being from about 7.4 to 8.0 MPa) and 460° C. is tabulated, "emax". The term "e max" is the dimensionless strain which is corrected for any changes in the film due to decomposition and solvent loss (as extrapolated from the stress free slope) at the end of the 8 MPa cycle (more precisely, the maximum stress being from about 7.4 to 8.0 MPa). The term "e rec" is the strain recovery immediately following the 8 MPa cycle (more precisely, the maximum stress being from about 7.4 to 8.0 MPa), but at no additional applied force (other than the initial static force of 0.005 N), which is a measure of the recovery of the material, corrected for any changes in film due to decomposition and solvent loss as measured by the stress free slope). The parameter, labeled "stress free slope", is also tabulated in units of dimensionless strain/min and is the change in strain when the initial static force of 0.005 N is applied to the sample after the initial application of the 8 Mpa stress (more precisely, the maximum stress being from about 7.4 to 8.0 MPa). This slope is calculated based on the dimensional change in the film ("stress free strain") over the course of 30 min following the application of the 8 MPa stress cycle (more precisely, the maximum stress being from about 7.4 to 8.0 MPa). Typically the stress free slope is negative. However, the stress free slope value is provided as an absolute value and hence is always a positive number.

The third column, e plast, describes the plastic flow, and is a direct measure of high temperature creep, and is the difference between e max and e rec.

In general, a material which exhibits the lowest possible strain (e max), the lowest amount of stress plastic flow (e plast) and a low value of the stress free slope is desirable.

TABLE 2

| Example | Additive | Applied Stress (MPA)* | e max (strain at applied stress) | e rec | Plastic deformation ((eplast) = e max − e rec)) | Absolute Value Stress Free Slope (/min) | Wt fraction of inorganic filler in polyimide | Vol fraction inorganic filler in polyimide* |
|---|---|---|---|---|---|---|---|---|
| Example 1 | TiO$_2$ (FLT-110) | 7.44 | 4.26E−03 | 3.87E−03 | 3.89E−04 | 2.82E−06 | 0.338 | 0.147 |
| Comparative Example A | None | 7.52 | 1.50E−02 | 1.40E−02 | 9.52E−04 | 9.98E−06 | | |
| Example 2* | TiO$_2$ (FLT-200) | 4.64 | 3.45E−03 | 3.09E−03 | 3.67E−04 | 2.88E−06 | 0.346 | 0.152 |
| Example 3 | TiO$_2$ (FLT-300) | 7.48 | 2.49E−03 | 2.23E−03 | 2.65E−04 | 1.82E−06 (82% lower than comparative example) | 0.346 | 0.152 |
| Example 4 A | TiO$_2$ (FLT-100) | 7.48 | 3.56E−03 | 3.18E−03 | 3.77E−04 | 3.40E−06 | 0.338 | 0.147 |
| Example 4 | TiO$_2$ (FLT-110) | 7.45 | 2.42E−03 | 2.20E−03 | 2.16E−04 | 1.73E−06 | 0.338 | 0.147 |
| Example 5 | TiO$_2$ (FLT-110) | 7.48 | 7.83E−03 | 7.05E−03 | 7.84E−04 | 5.61E−06 | 0.247 | 0.100 |
| Example 6 | TiO$_2$ (FLT-110) | 7.46 | 4.35E−03 | 3.97E−03 | 3.82E−04 | 2.75E−06 | 0.297 | 0.125 |
| Example 7 | TiO$_2$ (FLT-110) | 7.46 | 3.32E−03 | 3.02E−03 | 3.00E−04 | 1.98E−06 | 0.337 | 0.147 |

TABLE 2-continued

| Example | Additive | Applied Stress (MPA)* | e max (strain at applied stress) | e rec | Plastic deformation ((eplast) = e max − e rec )) | Absolute Value Stress Free Slope (/min) | Wt fraction of inorganic filler in polyimide | Vol fraction inorganic filler in polyimide* |
|---|---|---|---|---|---|---|---|---|
| Example 8 | TiO$_2$ (FLT-110) | 8.03 | 3.83E−03 | 3.53E−03 | 2.97E−04 | 3.32E−06 | 0.337 | 0.146 |
| Example 9 | Talc | 8.02 | 5.65E−03 | 4.92E−03 | 7.23E−04 | 7.13E−06 | 0.337 | 0.208 |
| Example 10 | TiO$_2$ (FTL-110) | 7.41 | 1.97E−03 | 1.42E−04 | 2.66E−04 | 1.37E−06 | 0.426 | 0.200 |
| Comparative B | Wollastonite powder | 8.02 | 1.07E−02 | 9.52E−03 | 1.22E−03 | 1.15E−05 | 0.255 | 0.146 |

*Maximum applied stress was in a range from 7.4 to 8.0 MPa, except for Example 2 which was conducted at 4.64 MPa Table 2 provides filler loadings in both weight fraction and volume fraction. Filler loadings of similar volume fractions are generally a more accurate comparison of fillers, since filler performance tends to be primarily a function of space occupied by the filler, at least with respect to the present disclosure. The volume fraction of the filler in the films was calculated from the corresponding weight fractions, assuming a fully dense film and using these densities for the various components:
1.42 g/cc for density of polyimide; 4.2 g/cc for density of acicular TiO$_2$; 2.75 g/cc for density of talc; and 2.84 g/cc for wollastonite Example 11

168.09 grams of a polyamic acid (PAA) prepolymer solution prepared from BPDA and PPD in DMAC (dimethylacetamide) with a slight excess of PPD (15 wt % PAA in DMAC)) were blended with 10.05 grams of Flextalc 610 talc for 2 minutes in a Thinky ARE-250 centrifugal mixer to yield an off-white dispersion of the filler in the PAA solution.

The dispersion was then pressure-filtered through a 45 micron polypropylene filter membrane. Subsequently, small amounts of PMDA (6 wt % in DMAC) were added to the dispersion with subsequent mixing to increase the molecular weight and thereby the solution viscosity to about 3460 poise. The filtered solution was degassed under vacuum to remove air bubbles and then this solution was coated onto a piece of Duofoil® aluminum release sheet (~9 mil thick), placed on a hot plate, and dried at about 80-100° C. for 30 min to 1 hour to a tack-free film.

The film was subsequently carefully removed from the substrate and placed on a pin frame and then placed into a nitrogen purged oven, ramped from 40° C. to 320° C. over about 70 minutes, held at 320° C. for 30 minutes, then ramped to 450° C. over 16 minutes and held at 450° C. for 4 minutes, followed by cooling. The film on the pin frame was removed from the oven and separated from the pin frame to yield a filled polyimide film (about 30 wt % filler).

The approximately 1.9 mil (approximately 48 micron) film exhibited the following properties.
Storage modulus (E') by Dynamic Mechanical Analysis (TA Instruments, DMA-2980, 5° C./min) of 12.8 GPa at 50° C. and 1.3 GPa at 480° C., and a Tg (max of tan delta peak) of 341° C.
Coefficient of thermal expansion (TA Instruments, TMA-2940, 10° C./min, up to 380° C., then cool and rescan to 380° C.) of 13 ppm/° C. and 16 ppm/° C. in the cast and transverse directions, respectively, when evaluated between 50-350° C. on the second scan.
Isothermal weight loss (TA Instruments, TGA 2050, 20° C./min up to 500° C. then held for 30 min at 500° C.) of 0.42% from beginning to end of isothermal hold at 500° C.

Comparative Example C 200 grams of a polyamic acid (PAA) prepolymer solution prepared from BPDA and PPD in DMAC with a slight excess of PPD (15 wt % PAA in DMAC,) were weighed out. Subsequently, small amounts of PMDA (6 wt % in DMAC) were added stepwise in a Thinky ARE-250 centrifugal mixer to increase the molecular weight and thereby the solution viscosity to about 1650 poise. The solution was then degassed under vacuum to remove air bubbles and then this solution was coated onto a piece of Duofoil® aluminum release sheet (~9 mil thick), placed on a hot plate and dried at about 80-100° C. for 30 min to 1 hour to a tack-free film. The film was subsequently carefully removed from the substrate and placed on a pin frame then placed into a nitrogen purged oven, ramped from 40° C. to 320° C. over about 70 minutes, held at 320° C. for 30 minutes, then ramped to 450° C. over 16 minutes and held at 450° C. for 4 minutes, followed by cooling. The film on the pin frame was removed from the oven and separated from the pin frame to yield a filled polyimide film (0 wt % filler).

The approximately 2.4 mil (approximately 60 micron) film exhibited the following properties.
Storage modulus (E') by Dynamic Mechanical Analysis (TA Instruments, DMA-2980, 5° C./min) of 8.9 GPa at 50° C., and 0.3 GPa at 480° C., and a Tg (max of tan delta peak) of 348° C.
Coefficient of thermal expansion (TA Instruments, TMA-2940, 10° C./min, up to 380° C., then cool and rescan to 380° C.) of 18 ppm/° C. and 16 ppm/° C. in the cast and transverse directions, respectively, when evaluated between 50-350° C. on the second scan.
Isothermal weight loss (TA Instruments, TGA 2050, 20° C./min up to 500° C. then held for 30 min at 500° C.) of 0.44% from beginning to end of isothermal hold at 500° C.

Example 12

In a similar manner to Example 11, a polyamic acid polymer with Flextalc 610 at about 30 wt % was cast onto a 5 mil polyester film. The cast film on the polyester was placed in a bath containing approximately equal amounts of acetic anhydride and 3-picoline at room temperature. As the cast film imidized in the bath, it began to release from the polyester. At this point, the cast film was removed from the bath and the polyester, placed on a pinframe, and then placed in a oven and ramped as described in Example 11. The resulting talc-filled polymide film exhibited a CTE by TMA (as in Example 11) of 9 ppm/° C. and 6 ppm/° C. in the cast and transverse directions, respectively.

Note that not all of the activities described above in the general description or the examples are required, that a portion of a specific activity may not be required, and that further activities may be performed in addition to those described. Still further, the order in which each of the activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that various modifications and changes can be made without departing from the scope of the invention as set forth in the claims below. Accordingly, the specification and any figures are to be regarded in an illustrative rather than a restrictive sense and all such modifications are intended to be included within the scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

When an amount, concentration, or other value or parameter is given as either a range, preferred range or a list of upper values and lower values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

What is claimed is:

1. A composite comprising a semiconductor material supported by a passivating layer, the passivating layer supported by a substrate, the substrate, comprising:
    a) a polyimide in an amount from 40 to 95 weight percent of the layer, the polyimide being derived from:
        i) at least one aromatic dianhydride, at least 85 mole percent of said aromatic dianhydride being a rigid rod type dianhydride, and
        ii) at least one aromatic diamine, at least 85 mole percent of said aromatic diamine being a rigid rod type diamine; and
    b) a filler that:
        a) is less than 800 nanometers in at least one dimension;
        b) has an aspect ratio greater than 3:1;
        c) is less than the thickness of the film in all dimensions; and
        d) is present in an amount from 5 to 60 weight percent of the total weight of the film,
    the substrate having a thickness from 8 to 150 microns.

2. A composite according to claim 1, wherein the passivating layer comprises silicon dioxide or aluminum nitride.

3. A composite according to claim 1, wherein the passivating layer has a thickness of less than 20 nanometers.

4. A composite according to claim 1, wherein the passivating layer is deposited on both surfaces of the substrate.

5. A composite according to claim 1, wherein the substrate comprises a metal layer having a thickness of less than 50 nanometers on the side thereof remote from the semiconductor material.

6. A composite according to claim 5, wherein the metal layer has walls defining apertures extending through the metal layer.

7. A composite according to claim 6, wherein the metal layer comprises chromium.

8. A composite according to claim 1, wherein a layer of dielectric material is located over the metal layer and under the semiconductor material.

9. A composite according to claim 8, wherein the layer of dielectric material comprises silicon nitride.

10. A composite according to claim 1, wherein the semiconductor material comprises amorphous silicon.

11. A composite according to claim 10, wherein the semiconductor material further comprises a layer of n-type silicon on the amorphous silicon.

12. A composite according to claim 11, further comprising a patterned layer of metal located on the n-type silicon, wherein the n-type silicon defines a complementary pattern to the pattern of the metal so that the n-type silicon is only under the metal pattern.

13. A composite according to claim 1, wherein the filler is smaller than 600 nm in at least one dimension.

14. A composite according to claim 1, wherein the filler comprises acicular titanium dioxide.

15. A composite according to claim 1, wherein:
    a) the rigid rod type dianhydride is selected from a group consisting of 3,3',4,4'-biphenyl tetracarboxylic dianhydride (BPDA), pyromellitic dianhydride (PMDA), and mixtures thereof; and
    b) the rigid rod type diamine is selected from 1,4-diaminobenzene (PPD), 4,4'-diaminobiphenyl, 2,2'-bis(trifluoromethyl) benzidene (TFMB), 1,5-naphthalenediamine, 1,4-naphthalenediamine, and mixtures thereof.

* * * * *